(12) United States Patent
Liu et al.

(10) Patent No.: US 11,197,387 B2
(45) Date of Patent: Dec. 7, 2021

(54) SERVER APPARATUS AND FIXING MECHANISM THEREOF

(71) Applicant: Wistron Corporation, New Taipei (TW)

(72) Inventors: Hui-Tao Liu, New Taipei (TW); Chia-Hsin Liu, New Taipei (TW); Fu-Chieh Hsu, New Taipei (TW); Zhi-Tao Yu, New Taipei (TW)

(73) Assignee: Wistron Corporation, New Taipei (TW)

( * ) Notice: Subject to any disclaimer, the term of this patent is extended or adjusted under 35 U.S.C. 154(b) by 301 days.

(21) Appl. No.: 16/583,202

(22) Filed: Sep. 25, 2019

(65) Prior Publication Data

US 2020/0396859 A1 Dec. 17, 2020

(30) Foreign Application Priority Data

Jun. 14, 2019 (CN) .......................... 201910517414.4

(51) Int. Cl.
*H05K 7/14* (2006.01)
*G11B 33/12* (2006.01)

(52) U.S. Cl.
CPC ......... *H05K 7/1489* (2013.01); *G11B 33/124* (2013.01); *H05K 7/1487* (2013.01)

(58) Field of Classification Search
CPC ... H05K 7/1489; H05K 7/1487; G11B 33/124
See application file for complete search history.

(56) References Cited

U.S. PATENT DOCUMENTS

| 9,122,458 | B2 * | 9/2015 | Yu ............................ G06F 1/185 |
| 9,959,909 | B1 * | 5/2018 | Chang ................... G11B 33/124 |
| 2020/0375054 | A1 * | 11/2020 | Pham .................... H05K 7/1488 |

* cited by examiner

*Primary Examiner* — James Wu
*Assistant Examiner* — Hung Q Dang
(74) *Attorney, Agent, or Firm* — Winston Hsu (57) ABSTRACT

A server apparatus includes a fixing mechanism and a holding casing having a fixing member. The fixing mechanism includes a containing casing having a guiding slot and an engaging hole, an actuator having a driving member and pivoted to the containing casing to be movable between a first position and a second position, and a driven structure. The driven structure has a driven member and a first slot and is slidable on the holding casing. When the engaging hole is engaged with the fixing member and the actuator moves to the first position, the driving member slides along the first slot to drive the driven structure to a mounting position, so as to slide the driven member along the guiding slot.

19 Claims, 10 Drawing Sheets

SERVER APPARATUS AND FIXING MECHANISM THEREOF

BACKGROUND OF THE INVENTION

1. Field of the Invention

The present disclosure relates to a server apparatus and a fixing mechanism thereof, and more specifically, to a server apparatus utilizing an actuator to mounting a containing casing on a holding casing and a fixing mechanism thereof.

2. Description of the Prior Art

In general, a HDD (Hard Disk Drive) mounting process of a server involves mounting multiple HDDs on a containing casing (e.g. a HDD enclosure) and then inserting the containing casing into a server casing from a front or rear section of the server casing. As such, the HDD mounting process could be completed quickly and efficiently.

Besides the aforesaid design of mounting the containing casing on the front or rear section of the server casing, the prior art adopts the design that an additional containing casing having HDDs disposed therein is mounted on a middle section of the server casing for increasing data storage space of the server and improving internal space usage efficiency of the server casing. However, the additional containing casing could only be mounted on the middle section of the server casing from up to down since there have been server related components (e.g. HDD modules, heat dissipating modules, and mainboard modules) mounted on the front and rear sections of the server casing. Thus, the aforesaid design not only causes a time-consuming and strenuous mounting process, but also makes the containing casing hard to assemble.

SUMMARY OF THE INVENTION

The present disclosure provides a server apparatus including a holding casing and a fixing mechanism. The holding casing has at least one first side plate. The at least one first side plate has a fixing member. The fixing mechanism includes a containing casing, an actuator and a driven structure. The containing casing has a second side plate corresponding to the at least one first side plate. The second side plate has a guiding slot and an engaging hole. The actuator is pivoted to the second side plate and movable between a first position and a second position relative to the containing casing. The actuator has a first driving member. The driven structure has a driven member and a first slot and is slidable between an initial position and a mounting position. When the engaging hole is engaged with the fixing member and the actuator moves to the first position, the first driving member slides along the first slot to drive the driven structure to a mounting position relative to the first side plate, so as to slide the driven member along the guiding slot.

The present disclosure further provides a fixing mechanism applied to assembling with a holding casing of a server apparatus. The holding casing has at least one first side plate. The at least one first side plate has a fixing member. The fixing mechanism includes a containing casing, an actuator and a driven structure. The containing casing has a second side plate corresponding to the at least one first side plate. The second side plate has a guiding slot and an engaging hole. The actuator is pivoted to the second sideplate and movable between a first position and a second position relative to the containing casing. The actuator has a first driving member. The driven structure has a driven member and a first slot and is slidable between an initial position and a mounting position. When the engaging hole is engaged with the fixing member and the actuator moves to the first position, the first driving member slides along the first slot to drive the driven structure to a mounting position relative to the first side plate, so as to slide the driven member along the guiding slot.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
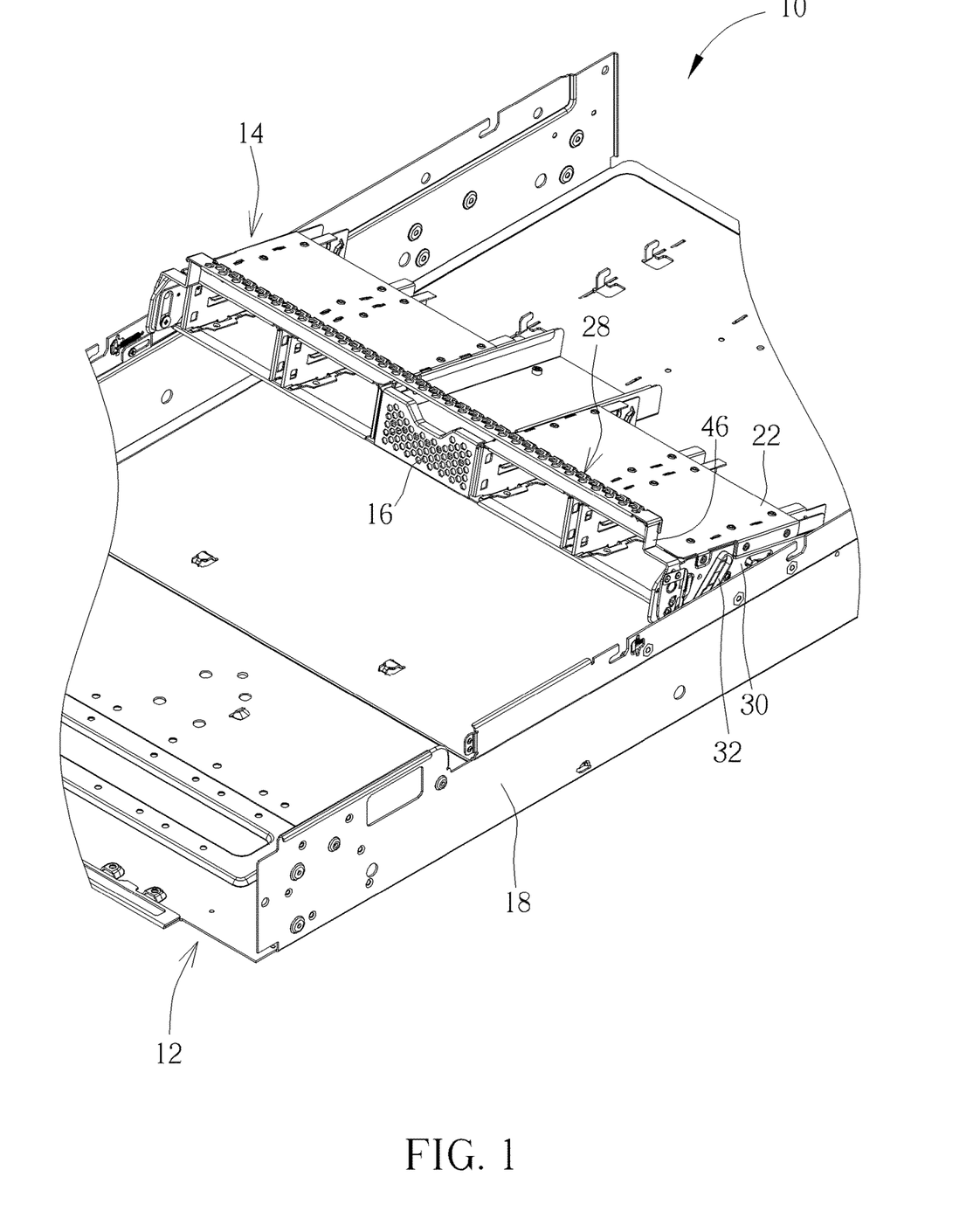
FIG. 1 is a diagram of a server apparatus according to an embodiment of the present disclosure.
Figure 2:
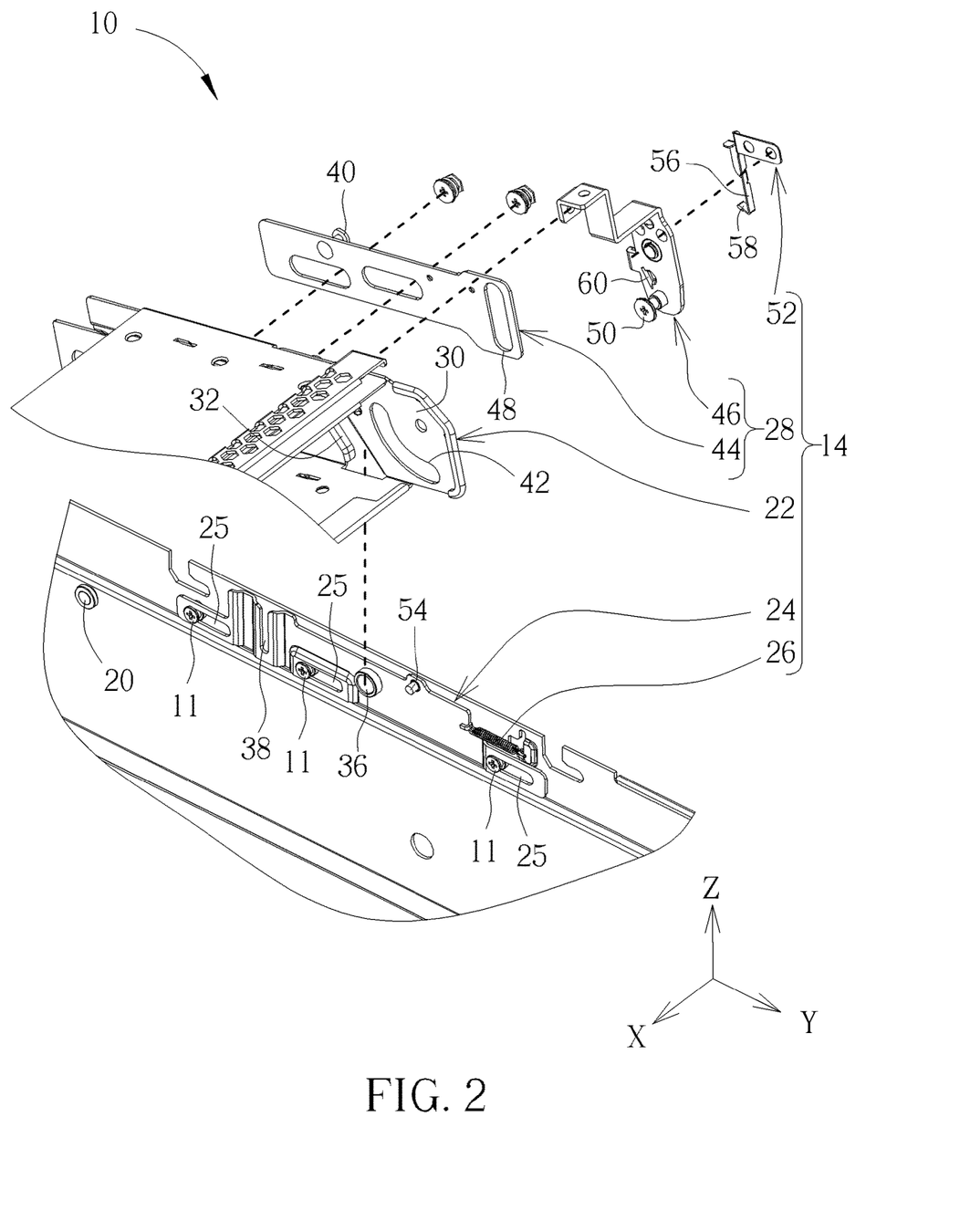
FIG. 2 is a partial exploded diagram of the server apparatus in FIG. 1.
Figure 3:
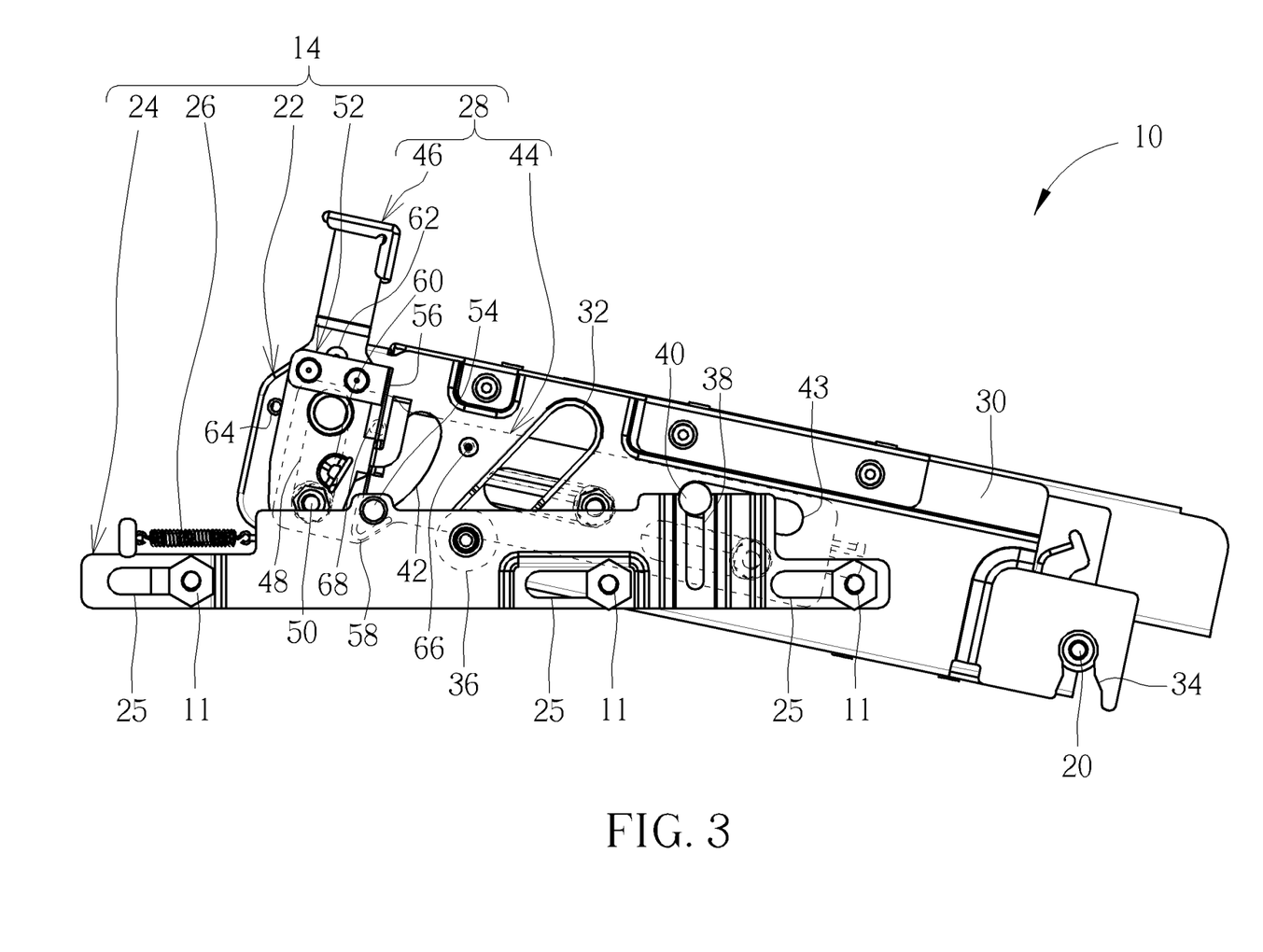
FIG. 3 is a side view of the server apparatus in FIG. 1.

Please refer to FIG. 1, FIG. 2, and FIG. 3. FIG. 1 is a diagram of a server apparatus 10 according to an embodiment of the present disclosure. FIG. 2 is a partial exploded diagram of the server apparatus 10 in FIG. 1. FIG. 3 is a side view of the server apparatus 10 in FIG. 1. For clearly showing the mechanical design of the server apparatus 10, a fixing member 20 of a holding casing 12 is only shown in FIG. 3 (i.e. the remaining portions of the holding casing 12 is omitted in FIG. 3) and a transmission structure 44 is briefly depicted by dotted lines in FIG. 3.

As shown in FIG. 1, FIG. 2, and FIG. 3, the server apparatus 10 includes the holding casing 12, a fixing mechanism 14, and at least one electronic device 16 (preferably a hard disk drive and one shown in FIG. 1, but the present disclosure is not limited thereto). The fixing mechanism 14 is used for mounting the electronic device 16 on the holding casing 12 (preferably mounted on a middle section of the holding casing 12, but the present disclosure is not limited thereto). In practical application, the fixing design of the fixing mechanism 14 is preferably applied to two side plates of the holding casing 12 for mounting the electronic device 16 on the holding casing 12 effortlessly and smoothly (but the present disclosure is not limited thereto, meaning that it could be only applied to one side plate of the holding casing 12 for simplifying the mechanical design of the server apparatus 10). More detailed description for the fixing mechanical design of the fixing mechanism 14 and one of first side plates 18 of the holding casing 12 is provided as follows, and the related description for the fixing mechanical design of the other first side plate 18 could be reasoned by analogy and omitted herein.

As shown in FIGS. 1-3, the holding casing 12 could be used for mounting of server related components (e.g. HDD Modules, heat dissipating modules, and mainboard modules) and has at least one first side plate 18 (two shown in FIG. 1, but the present disclosure is not limited thereto). The first side plate 18 has a fixing member 20 (preferably a fixing pin, but the present disclosure is not limited thereto). The fixing mechanism 14 includes a containing casing 22, a driven structure 24, a returning member 26 (preferably a spring, but the present disclosure is not limited thereto, meaning that the present disclosure could adopts other returning structural design, e.g. a torsion spring), and an actuator 28. The containing casing 22 has a second side plate 30 corresponding to the first side plate 18. The second side plate 30 has a guiding slot 32 and an engaging hole 34. The driven structure 24 has a driven member 36 (preferably a roller pin, but the present disclosure is not limited thereto) and a first slot 38 and is slidably disposed on the first side plate 18 to be slidable between an initial position and a mounting position (preferably slidable in a Y-axis direction as shown in FIG. 2, but the present disclosure is not limited thereto). The first slot 38 could preferably extend in a direction (preferably a Z-axis direction as shown in FIG. 2, but the present disclosure is not limited thereto) perpendicular to the sliding direction of the driven structure 24. In this embodiment, the driven structure 24 could be slidably disposed on the first side plate 18 by a pillar-to-slot sliding design, but the present disclosure is not limited thereto, meaning that the present disclosure could adopt other sliding design, such as a block-to-slot sliding design. For example, as shown in FIG. 2, the fixing mechanism 14 could utilize at least one screw 11 (three as shown in FIG. 2, but the present disclosure is not limited thereto) to penetrate through a corresponding limiting slot 25 on the driven structure 24 for disposing the driven structure 24 on the first side plate 18. In such a manner, when the screw 11 slides along the limiting slot 25, the driven structure 24 can slide on the first side plate 18. The returning member 26 is connected to the first side plate 18 and the driven structure 24. Accordingly, the returning member 26 could drive the driven structure 24 to slide to the initial position relative to the first side plate 18, so as to make the driven structure 24 have a movement tendency toward the initial position as shown in FIG. 2.

As shown in FIGS. 2-3, the actuator 28 is pivoted to the second side plate 30 to be movable between a first position and a second position relative to the containing casing 22. The actuator 28 has a first driving member 40 (preferably a pin, but the present disclosure is not limited thereto). To be more specific, in this embodiment, the guiding slot 32 is an oblique slot (the oblique angle is preferably between 30° and 60°, but the present disclosure is not limited thereto), the second side plate 30 could further have an arc-shaped slot and a second slot 43, and the actuator 28 includes the transmission structure 44 and a handle 46. The present disclosure preferably adopts the aforesaid sliding design applied to the driven structure 24 and the first side plate 18 (but the present disclosure is not limited thereto) to make the transmission structure 44 slidably disposed on the second side plate 30. A third slot 48 is formed on the transmission structure 44 corresponding to the arc-shaped slot 42. The transmission structure 44 could have the first driving member 40 to be movably disposed through the second slot 43. The handle 46 is pivoted to the second side plate 30 and has the second driving member 50 (preferably a pin, but the present disclosure is not limited thereto). The second driving member 50 could pass through the arc-shaped slot 42 to be movably disposed through the third slot 48.

In practical application, as shown in FIGS. 2-3, the fixing mechanism 14 could further include an elastic hook 52 and the driven structure 24 could have a blocking member 54 (preferably a pin, but the present disclosure is not limited thereto) for preventing the fixing mechanism 14 from being taken out of the holding casing 12 accidentally. The elastic hook 52 has an elastic arm portion 56 and a hook portion 58. The elastic arm portion 56 is disposed on the handle 46. Accordingly, when the containing casing 22 is supported obliquely on the holding casing 12, the hook portion 58 hooks the blocking member 54 to prevent accidental detachment of the containing casing 22 from the holding casing 12. On the other hand, when the elastic arm portion 56 is pressed to deform, the hook portion 58 is disengaged from the blocking member 54 to release the containing casing 22, so as to allow that the user can detach the containing casing 22 from the holding casing 12 smoothly. To be noted, in this embodiment, the blocking protrusion 60 could be formed on the handle 46 and located at a side of the elastic arm portion 56 (as shown in FIG. 3). As such, when the elastic arm portion 56 is pressed, the blocking protrusion 60 could stop the elastic arm portion 56 for limiting deformation of the elastic arm portion 56, so as to prevent the user from over-pressing the elastic arm portion 56 to cause fracture of the elastic arm portion 56.

In addition, as shown in FIG. 3, a positioning protrusion 62 could be formed on the handle 46, and a positioning hole 64 could be formed on the second side plate 30 (but the present disclosure is not limited thereto, meaning that the present disclosure could adopt the design that the positioning hole 64 is formed on the handle 46 and the positioning protrusion 62 is formed on the second side plate 30 in another embodiment). Accordingly, when the handle 46 pivots downward to the first position, the positioning protrusion 62 is engaged with the positioning hole 64 to fix the handle 46 at the first position, so as to remind the user that the handle 46 has been rotated to a right position. Similarly, as shown in FIG. 3, a positioning protrusion 66 could be formed on the second side plate 30 and a positioning hole 68 could be formed on the transmission structure 44 (but the present disclosure is not limited thereto, meaning that the present disclosure could adopt the design that the positioning hole 68 is formed on the second side plate 30 and the positioning protrusion 66 is formed on the transmission structure 44 in another embodiment). Accordingly, when the handle 46 pivots downward to the first position, the transmission structure 44 slides to a position where the positioning protrusion 66 is engaged with the positioning hole 68 to fix the transmission structure 44 at the second side plate 30, so as to generate the fixing effect and prevent the wrong operations.

Figure 4:
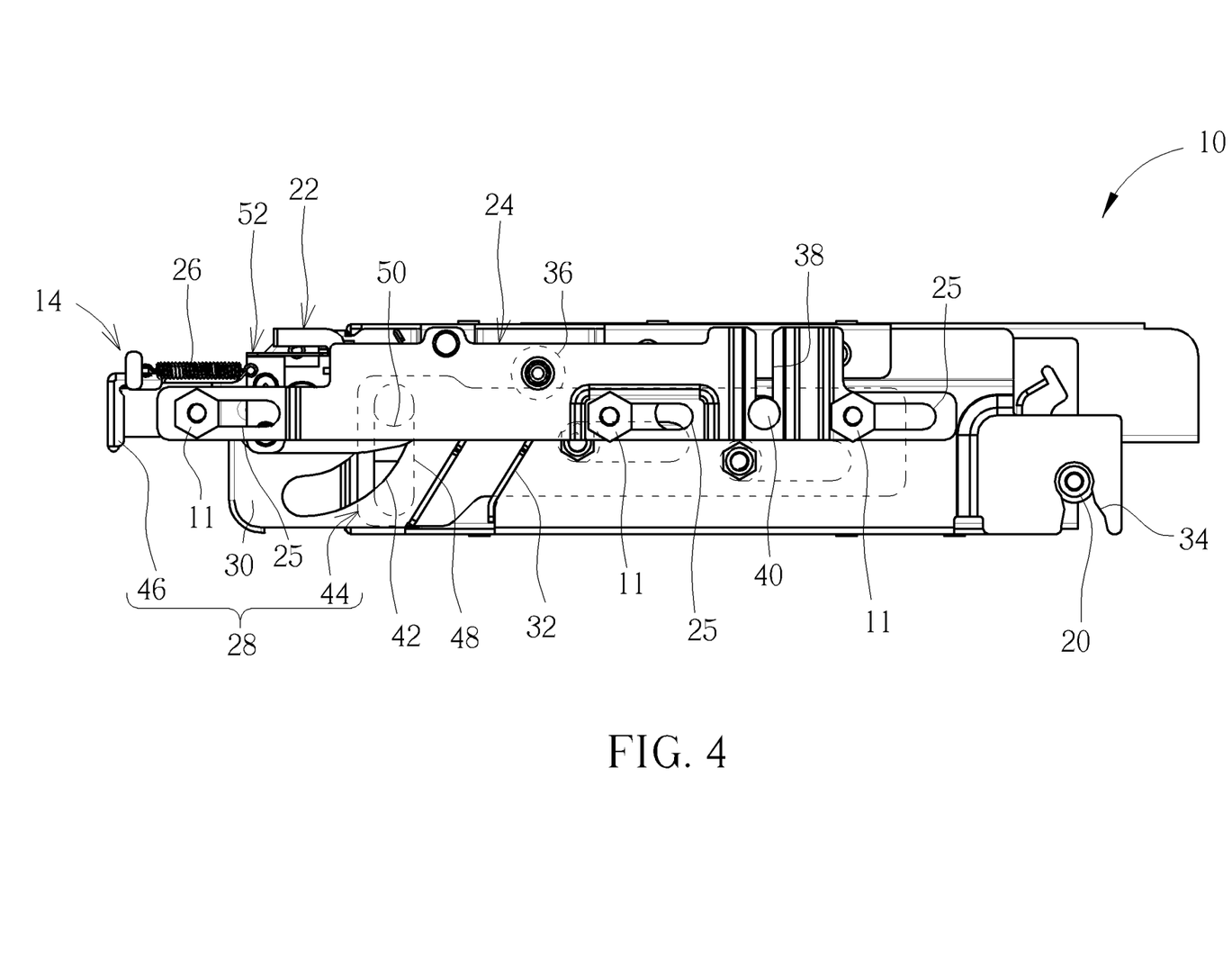
FIG. 4 is a side view of a handle in FIG. 3 rotating to a first position.
Figure 5:
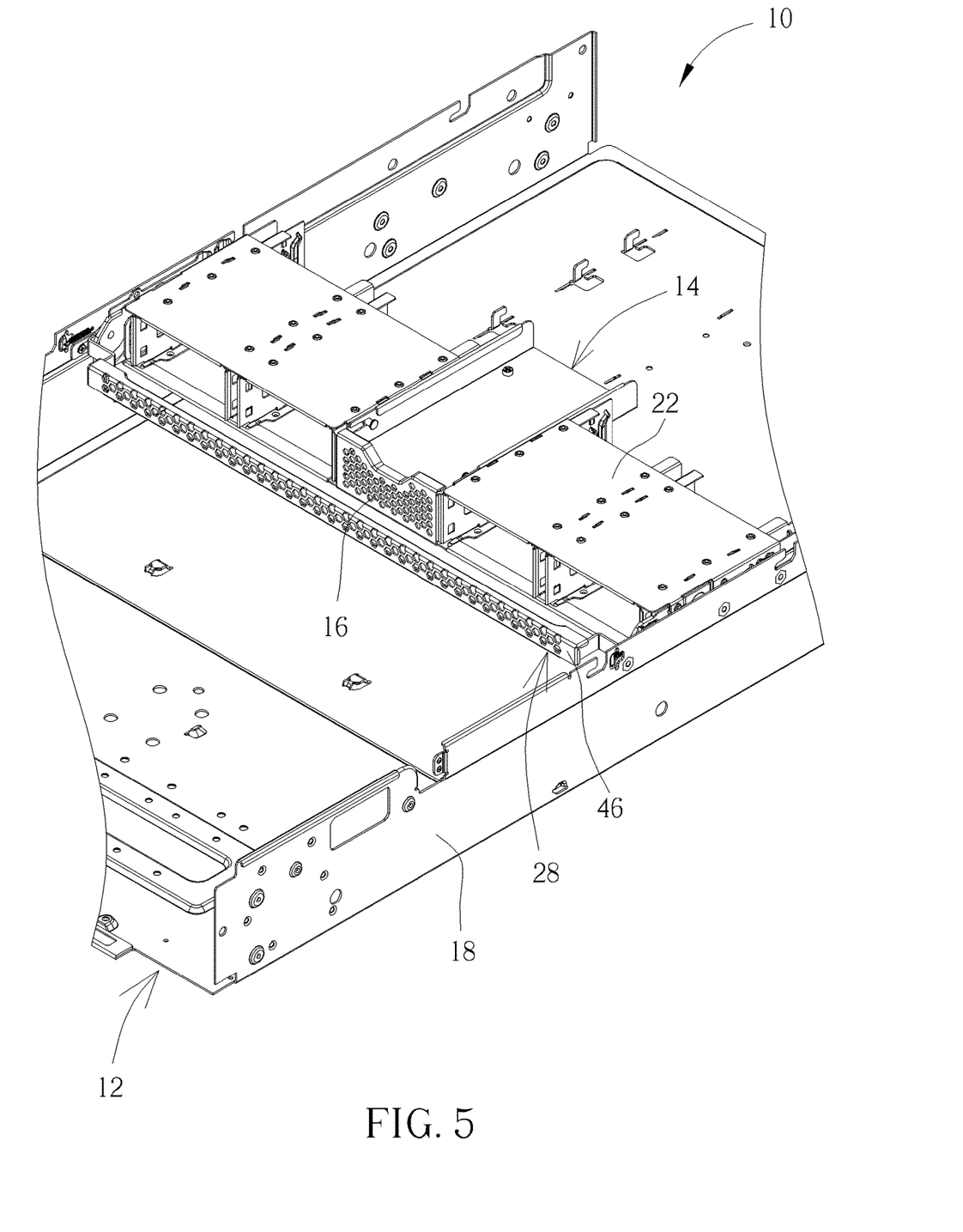
FIG. 5 is a diagram of a containing casing in FIG. 1 moving downward to be contained in a holding casing.

More detailed description for the assembly operation of the server apparatus 10 is provided as follows. Please refer to FIG. 1, FIG. 3, FIG. 4, and FIG. 5. FIG. 4 is a side view of the handle 46 in FIG. 3 rotating to the first position. FIG. 5 is a diagram of the containing casing 22 in FIG. 1 moving downward to be contained in the holding casing 12. When the user wants to perform the assembly operation of the server apparatus 10, the user just needs to hold the handle 46 and lift the containing casing 22 having the electronic device 16 mounted thereon to be located above the holding casing 12. Subsequently, the engaging hole 34 could be engaged with the fixing member 20, the first driving member 40 could abut against the first slot 38, and the driven member 36 could abut against the guiding slot 32. At this time, since the elastic force provided by the returning member 26 could keep the driven structure 24 at the initial position as shown in FIG. 3, the first slot 38 could abut against the first driving member 40 laterally, such that the containing casing 22 could be supported on the holding casing 12 obliquely and protrusively (at this time, as shown in FIG. 3, the hook portion 58 hooks the blocking member 54 to prevent the wrong operations) for the subsequent mounting operations.

Subsequently, the user could pull the handle 46 from the second position as shown in FIG. 3 counterclockwise to the first position as shown in FIG. 4. During the aforesaid process, with rotation of the handle 46, the second driving member 50 could slide to a position as shown in FIG. 4 in the third slot 48 along the arc-shaped slot 42. As such, the second driving member 50 could push the transmission structure 44 via the third slot 48 to slide the first driving member 40 from the position as shown in FIG. 3 downward to the position as shown in FIG. 4 along the first slot 38, so as to slide the driven structure 24 from the initial position as shown in FIG. 3 to the mounting position as shown in FIG. 4. At this time, with sliding of the driven structure 24, the driven member 36 could abut against the guiding slot 32 and slide obliquely and upwardly from the position as shown in FIG. 3 to the position as shown in FIG. 4. In such a manner, the reaction force caused by the driven member 36 pushing the guiding slot 32 can drive the containing casing 22 to take the fixing member 20 as a pivot shaft to move downward to a position where the containing casing 22 is horizontally contained in the holding casing 12, so as to complete the assembly operation of the server apparatus 10.

On the other hand, when the user wants to perform the disassembly operation of the server apparatus 10, the user just needs to pull the handle 46 in FIG. 5 from the first position as shown in FIG. 4 clockwise to the second position as shown in FIG. 3. During the aforesaid process, with rotation of the handle 46, the second driving member 50 could slide to the position as shown in FIG. 3 in the third slot 48 along the arc-shaped slot 42. As such, the second driving member 50 could push the transmission structure 44 via the third slot 48 to slide the first driving member 40 from the position as shown in FIG. 4 upward to the position as shown in FIG. 3 along the first slot 38, so as to slide the driven structure 24 from the mounting position as shown in FIG. 4 back to the initial position as shown in FIG. 3. At this time, with sliding of the driven structure 24, the driven member 36 could abut against the guiding slot 32 and slide obliquely and downwardly from the position as shown in FIG. 4 to the position as shown in FIG. 3.

In such a manner, the reaction force caused by the driven member 36 pushing the guiding slot 32 can drive the containing casing 22 to take the fixing member 20 as the pivot shaft to move upward to a position where the containing casing 22 is supported obliquely and protrusively on the holding casing 12 (at this time, as mentioned above, the hook portion 58 hooks the blocking member 54). Finally, the user just needs to press the elastic arm portion 56 to disengage the hook portion 58 from the blocking member 54 for releasing the containing casing 22 from the holding casing 12, such that the user can detach the containing casing 22 from the holding casing 12 smoothly for the subsequent replacement or maintenance of the electronic device 16.

In summary, via the design that the elastic force provided by the returning member 26 drives the first slot 38 of the driven structure 24 to abut against the first driving member 40 of the fixing mechanism 14, the containing casing 22 can be supported obliquely and steadily on the holding casing 12, so as to allow that the user can mount the containing casing 22 on the holding casing 12 or detach the containing casing 22 from the holding casing 12 conveniently. As such, the present disclosure can efficiently solve the prior art problem that the containing casing needs to be mounted on the middle section of the server casing from up to down to cause a time-consuming and strenuous mounting process and make the containing casing hard to assemble. Furthermore, the present disclosure adopts the design that the actuator is utilized to drive the driven structure to exert force upon the second side plate of the containing casing, to help the user mount the containing casing on the holding casing or detach the containing casing from the holding casing quickly and effortlessly via the aforesaid simple actuator rotating operations. Thus, the assembly and disassembly convenience of the server apparatus can be improved greatly.

Figure 6:
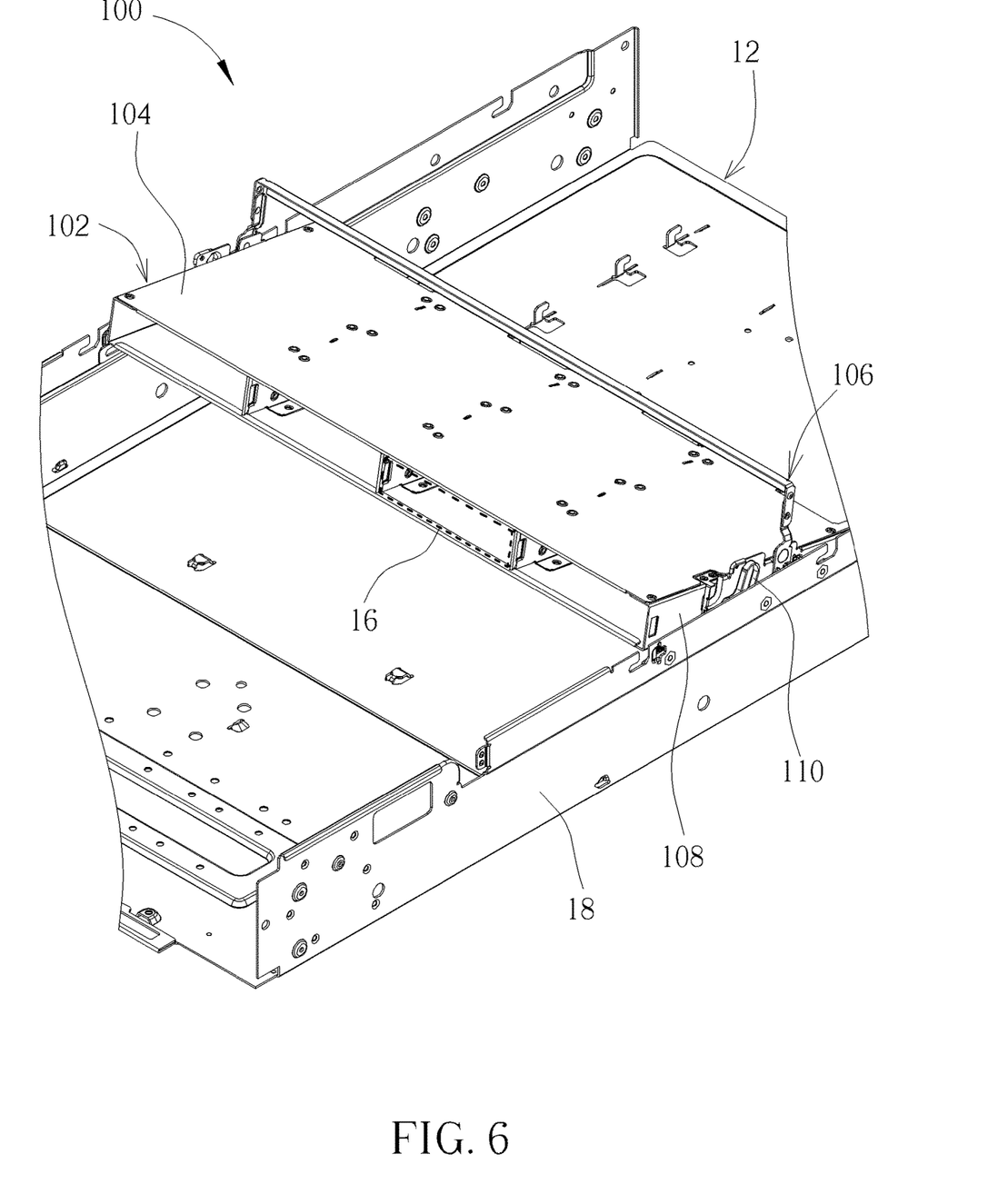
FIG. 6 is a diagram of a server apparatus according to another embodiment of the present disclosure.
Figure 7:
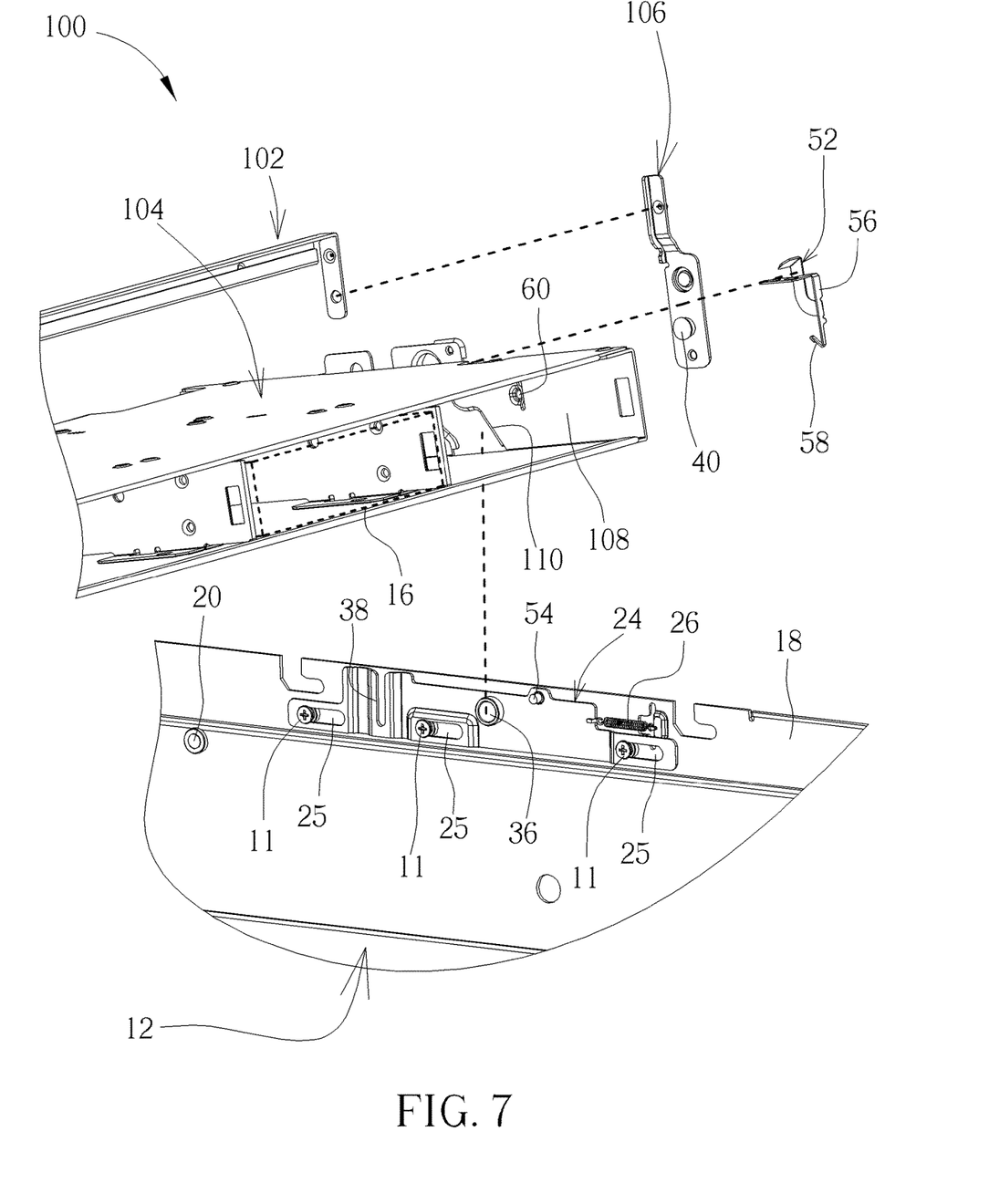
FIG. 7 is a partial exploded diagram of the server apparatus in FIG. 6.
Figure 8:
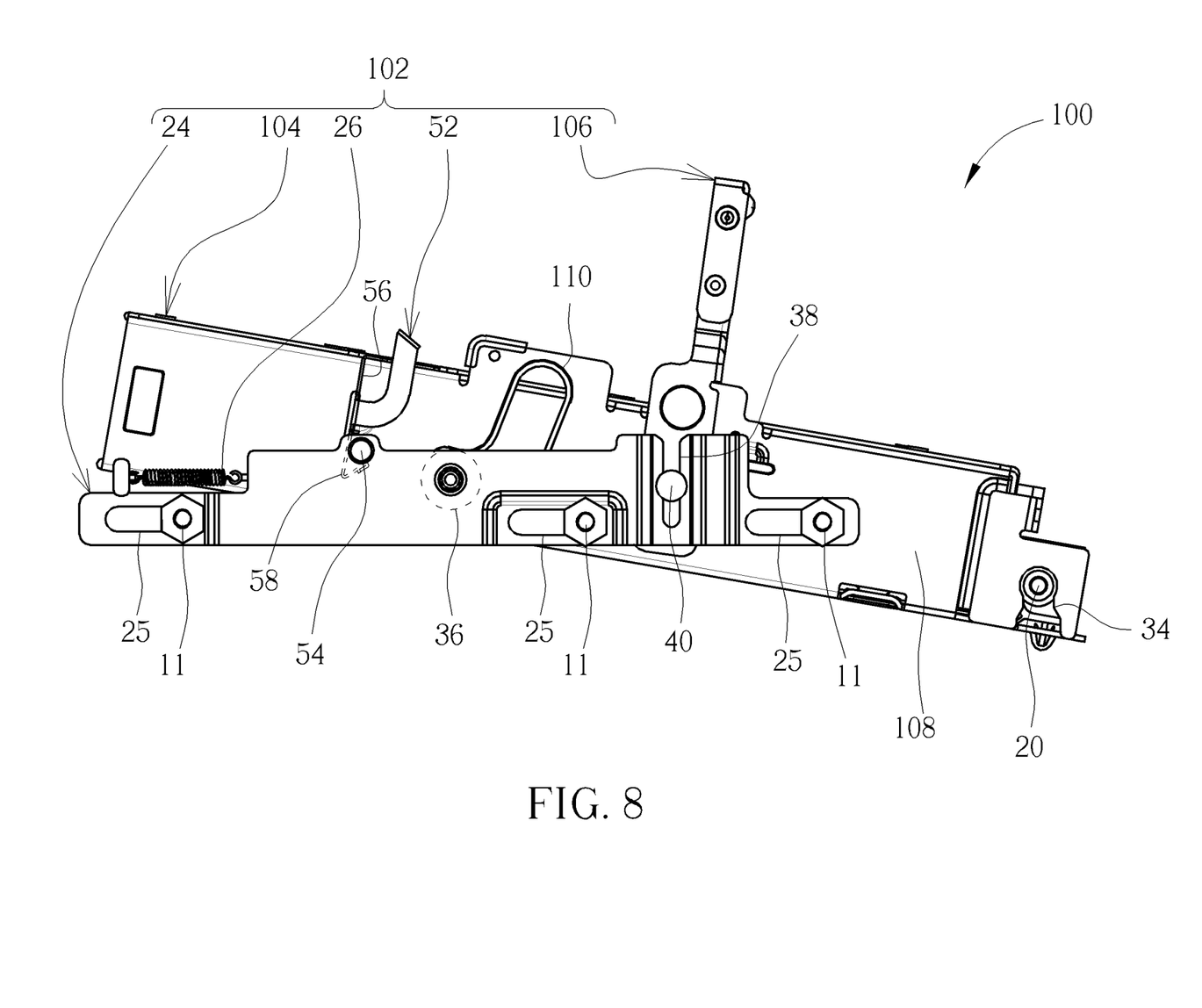
FIG. 8 is a side view of the server apparatus in FIG. 6.

It should be mentioned that the actuator structural design of the present disclosure is not limited to the aforesaid embodiment. That is, the present disclosure could adopt the design that the transmission structure is omitted in another embodiment. Please refer to FIG. 6, FIG. 7, and FIG. 8. FIG. 6 is a diagram of a server apparatus 100 according to another embodiment of the present disclosure. FIG. 7 is a partial exploded diagram of the server apparatus 100 in FIG. 6. FIG. 8 is a side view of the server apparatus 100 in FIG. 6. For clearly showing the mechanical design of the server apparatus 100, the fixing member 20 of the holding casing 12 is only shown in FIG. 8 (i.e. the remaining portions of the holding casing 12 is omitted in FIG. 8). Components both mentioned in this embodiment and the aforesaid embodiment represent components with similar structures or functions, and the related description is omitted herein.

As shown in FIG. 6, FIG. 7, and FIG. 8, the server apparatus 100 includes the holding casing 12, a fixing mechanism 102, and the electronic device 16 (briefly depicted by dotted lines in FIG. 6). The fixing mechanism 102 includes a holding casing 104, an actuator 106, the driven structure 24, the returning member 26, and the elastic hook 52. The containing casing 104 has a second side plate 108 corresponding to the first side plate 18. The second side plate 108 has a guiding slot 110 and an engaging hole 34. The elastic hook 52 and the blocking protrusion 60 are disposed on the second side plate 108. In this embodiment, the actuator 106 could be an integral handle having the first driving member 40 and is pivoted to the second side plate 108 to move between the first position and the second position relative to the containing casing 104, and the guiding slot 110 could be a curved slot matched with a track of the driven member 36 moving with the driven structure 24.

Figure 9:
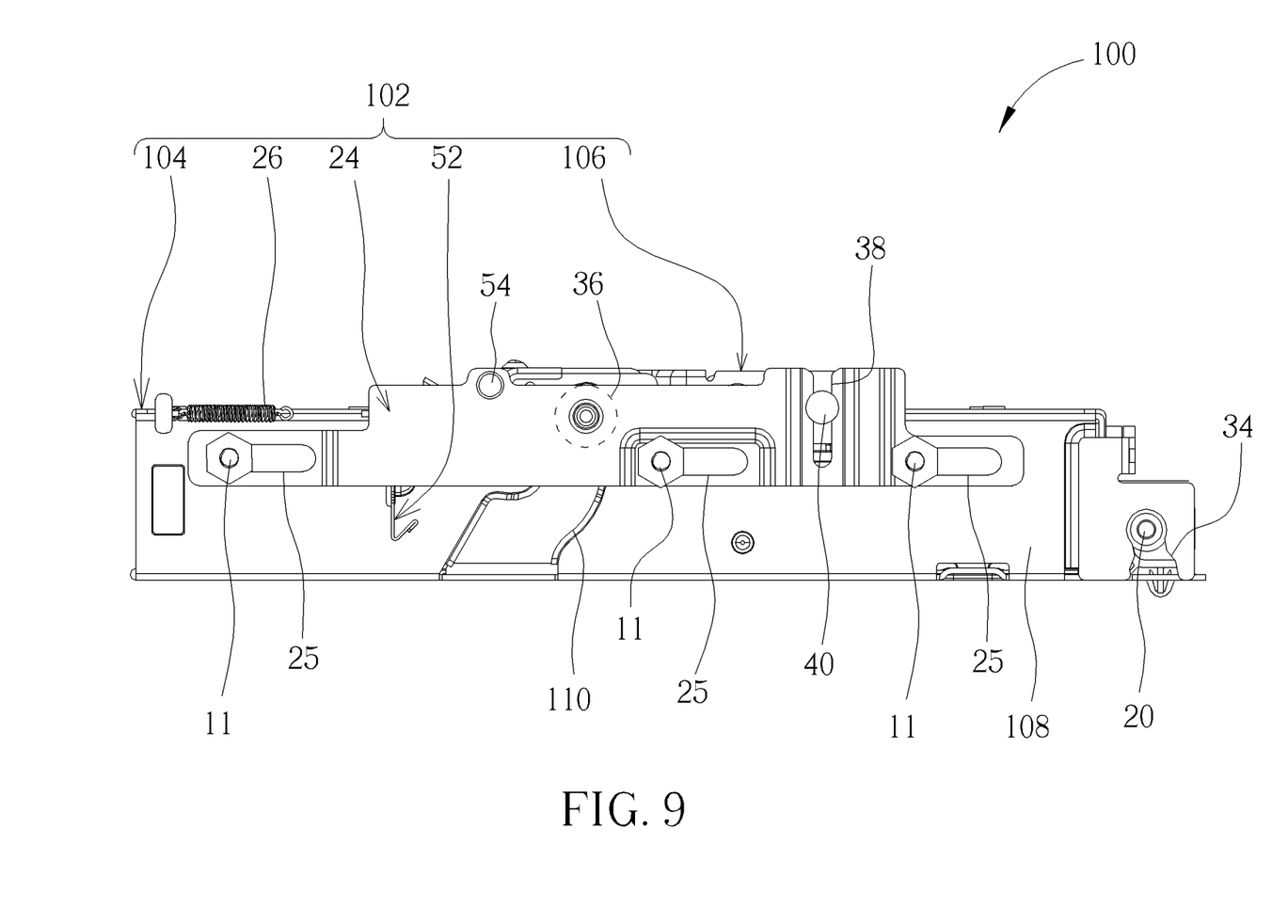
FIG. 9 is a side view of an actuator in FIG. 8 rotating to the first position.
Figure 10:
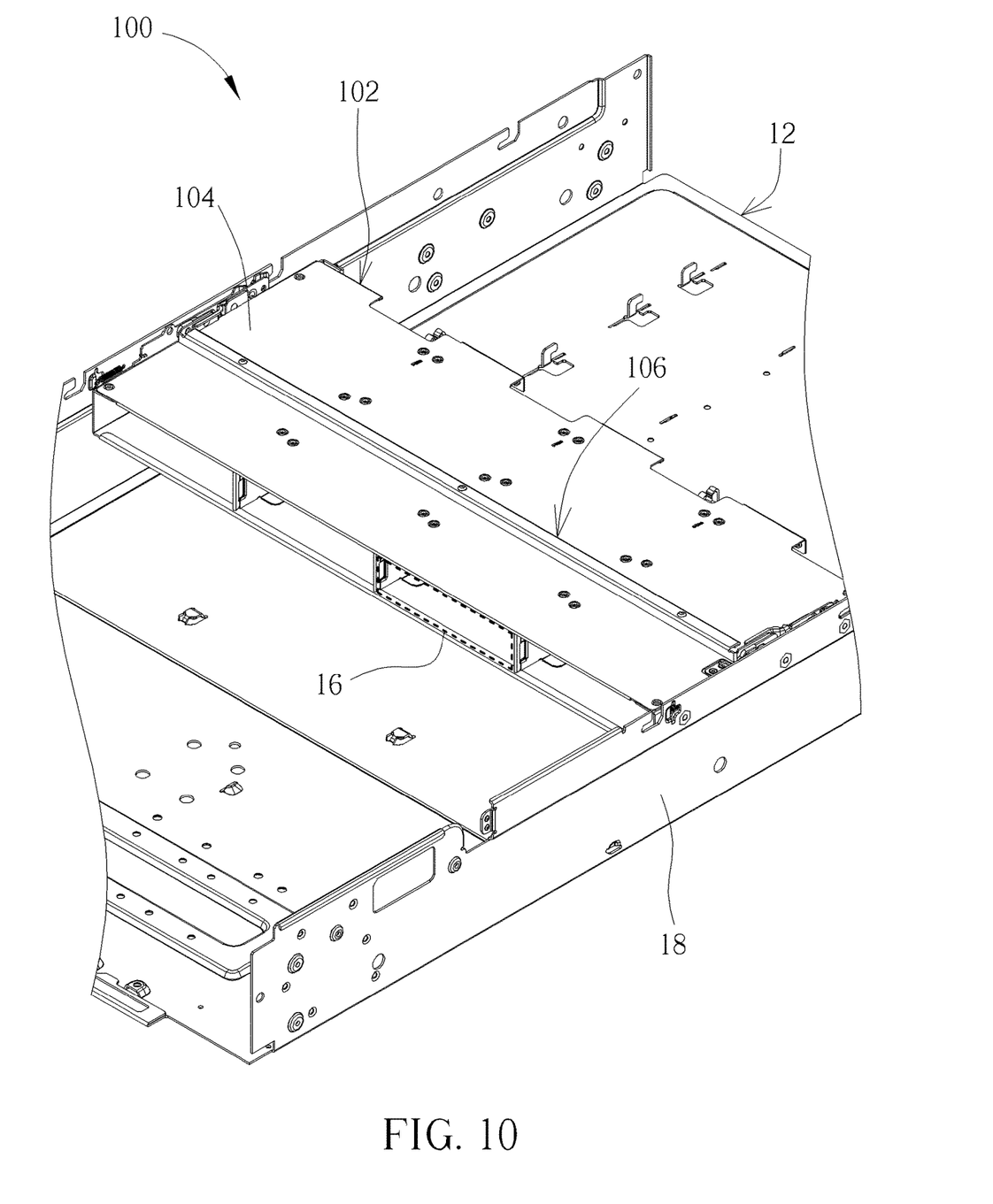
FIG. 10 is a diagram of a containing casing in FIG. 6 moving downward to be contained in the holding casing.

More detailed description for the assembly operation of the server apparatus 100 is provided as follows. Please refer to FIG. 6, FIG. 8, FIG. 9 and FIG. 10. FIG. 9 is a side view of the actuator 106 in FIG. 8 rotating to the first position. FIG. 10 is a diagram of the containing casing 104 in FIG. 6 moving downward to be contained in the holding casing 12. When the user wants to perform the assembly operation of the server apparatus 100, the user just needs to hold the actuator 106 and lift the containing casing 104 having the electronic device 16 mounted thereon to be located above the holding casing 12. Subsequently, the engaging hole 34 could be engaged with the fixing member 20, the first driving member 40 could abut against the first slot 38, and the driven member 36 could abut against the guiding slot 110. At this time, since the elastic force provided by the returning member 26 could keep the driven structure 24 at the initial position as shown in FIG. 8, the first slot 38 could abut against the first driving member 40 laterally, such that the containing casing 104 could be supported on the holding casing 12 obliquely and protrusively (at this time, as shown in FIG. 8, the hook portion 58 hooks the blocking member 54 to prevent the wrong operations) for the subsequent mounting operations.

Subsequently, the user could pull the actuator 106 from the second position as shown in FIG. 8 counterclockwise to the first position as shown in FIG. 9. During the aforesaid process, with rotation of the actuator 106, the first driving member 40 could slide form a position as shown in FIG. 8 upward to a position as shown in FIG. 9 along the third slot 38, so as to slide the driven structure 24 from the initial position as shown in FIG. 8 to the mounting position as shown in FIG. 9. At this time, with sliding of the driven structure 24, the driven member 36 could abut against the guiding slot 110 and slide from the position as shown in FIG. 8 to the position as shown in FIG. 9. In such a manner, the reaction force caused by the driven member 36 pushing the guiding slot 110 can drive the containing casing 104 to take the fixing member 20 as a pivot shaft to move downward to a position where the containing casing 104 is horizontally contained in the holding casing 12 as shown in FIG. 10, so as to complete the assembly operation of the server apparatus 100.

On the other hand, when the user wants to perform the disassembly operation of the server apparatus 100, the user just needs to pull the actuator 106 in FIG. 10 from the first position as shown in FIG. 9 clockwise to the second position as shown in FIG. 8. During the aforesaid process, with rotation of the actuator 106, the first driving member 40 slides from the position as shown in FIG. 9 upward to the position as shown in FIG. 8 along the first slot 38, so as to slide the driven structure 24 from the mounting position as shown in FIG. 9 back to the initial position as shown in FIG. 8. At this time, with sliding of the driven structure 24, the driven member 36 could abut against the guiding slot 110 and slide from the position as shown in FIG. 9 to the position as shown in FIG. 8.

In such a manner, the reaction force caused by the driven member 36 pushing the guiding slot 110 can drive the containing casing 104 to take the fixing member 20 as the pivot shaft to move upward to a position where the containing casing 104 is supported obliquely and protrusively on the holding casing 12 as shown in FIG. 6 (at this time, as mentioned above, the hook portion 58 hooks the blocking member 54). Finally, the user just needs to press the elastic arm portion 56 to disengage the hook portion 58 from the blocking member 54 for releasing the containing casing 104 from the holding casing 12, such that the user can detach the containing casing 104 from the holding casing 12 smoothly for the subsequent replacement or maintenance of the electronic device 16. As for the related description for the other designs of the server apparatus 100 (e.g. the positioning design of the positioning protrusion and the positioning hole), it could be reasoned by analogy according to the aforesaid embodiment and omitted herein.

To be noted, the electronic device 16 and the returning member 26 could be omissible components for simplifying the mechanical design of the server apparatus of the present disclosure. For example, in another embodiment that the electronic device 16 and the returning member 26 are omitted, the server apparatus provided by the present disclosure could be a casing apparatus composed of the holding casing and the fixing mechanism for containing related server components (e.g. HDD modules, heat dissipating modules, and mainboard modules) and could only have the effortless mounting function for utilizing the actuator to perform the assembly and disassembly operations of the containing casing. The related description for this embodiment could be reasoned by analogy according to the aforesaid embodiments and omitted herein.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A server apparatus comprising:
    a holding casing having at least one first side plate, the at least one first side plate having a fixing member; and
    a fixing mechanism comprising:
        a containing casing having a second side plate corresponding to the at least one first side plate, the second side plate having a guiding slot and an engaging hole;
        an actuator pivoted to the second side plate and movable between a first position and a second position relative to the containing casing, the actuator having a first driving member; and
        a driven structure having a driven member and a first slot and being slidable between an initial position and a mounting position;
    wherein when the engaging hole is engaged with the fixing member and the actuator moves to the first position, the first driving member slides along the first slot to drive the driven structure to a mounting position relative to the first side plate, so as to slide the driven member along the guiding slot.

2. The server apparatus of claim 1, wherein the guiding slot is an oblique slot, the second side plate further has an arc-shaped slot and a second slot, and the actuator comprises:
    a transmission structure slidably disposed on the second side plate and having a third slot corresponding the arc-shaped slot, the transmission structure having the first driving member to be movably disposed through the second slot; and
    a handle pivoted to the second side plate and having a second driving member, the second driving member passing through the arc-shaped slot to be movably disposed through the third slot;
    wherein when the handle pivots to the first position to slide the second driving member in the third slot along the arc-shaped slot, the second driving member pushes the transmission structure via the third slot to slide the first driving member along the first slot.

3. The server apparatus of claim 2, wherein an oblique angle of the oblique slot is between 30° and 60°.

4. The server apparatus of claim 2, wherein the fixing mechanism further comprises a positioning protrusion and a positioning hole, one of the positioning protrusion and the positioning hole is formed on the second side plate, the other of the positioning protrusion and the positioning hole is formed on the transmission structure, and the positioning protrusion is engaged with the positioning hole to fix the transmission structure on the second side plate when the handle pivots to the first position.

5. The server apparatus of claim 2, wherein the fixing mechanism further comprises a positioning protrusion and a positioning hole, one of the positioning protrusion and the positioning hole is formed on the handle, the other of the positioning protrusion and the positioning hole is formed on the second side plate, and the positioning protrusion is engaged with the positioning hole to fix the handle at the first position when the handle pivots to the first position.

6. The server apparatus of claim 1, wherein the fixing mechanism further comprises an elastic hook, the driven structure further has a blocking member, the elastic hook has an elastic arm portion and a hook portion, the elastic arm portion is disposed on one of the actuator and the second side plate, the hook portion hooks the blocking member to prevent detachment of the containing casing from the holding casing, and the hook portion is disengaged from the blocking member to release the containing casing for making the containing casing detachable from the holding casing when the elastic arm portion is pressed to deform.

7. The server apparatus of claim 6, wherein a blocking protrusion is formed on the one of the actuator and the second side plate and located on a side of the elastic arm portion, and the blocking protrusion blocks the elastic arm portion to constrain deformation of the elastic arm portion.

8. The server apparatus of claim 1, wherein the guiding slot is a curved slot matched with a track of the driven member moving with the driven structure.

9. The server apparatus of claim 1, wherein the fixing mechanism further comprises:
a returning member connected to the at least one first side plate and the driven structure for driving the driven structure to slide to the initial position relative to the at least one first side plate;
wherein when the actuator is located at the second position to make the containing casing abut against the first slot and the driven member via the first driving member and the guiding slot respectively, the returning member drives the first slot against the first driving member for making the containing casing supported on the holding casing obliquely and protrusively;
when the actuator moves to the first position, the first driving member slides the driven structure to the mounting position to make the driven member slide along the guiding slot for moving the containing casing to a position where the containing casing is horizontally contained in the holding casing.

10. The server apparatus of claim 1 further comprising:
at least one electronic device disposed in the containing casing.

11. A fixing mechanism applied to assembling with a holding casing of a server apparatus, the holding casing having at least one first side plate, the at least one first side plate having a fixing member, the fixing mechanism comprising:
a containing casing having a second side plate corresponding to the at least one first side plate, the second side plate having a guiding slot and an engaging hole;
an actuator pivoted to the second side plate and movable between a first position and a second position relative to the containing casing, the actuator having a first driving member; and
a driven structure having a driven member and a first slot and being slidable between an initial position and a mounting position;
wherein when the engaging hole is engaged with the fixing member and the actuator moves to the first position, the first driving member slides along the first slot to drive the driven structure to a mounting position relative to the first side plate, so as to slide the driven member along the guiding slot.

12. The fixing mechanism of claim 11, wherein the guiding slot is an oblique slot, the second side plate further has an arc-shaped slot and a second slot, and the actuator comprises:
a transmission structure slidably disposed on the second side plate and having a third slot corresponding the arc-shaped slot, the transmission structure having the first driving member to be movably disposed through the second slot; and
a handle pivoted to the second side plate and having a second driving member, the second driving member passing through the arc-shaped slot to be movably disposed through the third slot;
wherein when the handle pivots to the first position to slide the second driving member in the third slot along the arc-shaped slot, the second driving member pushes the transmission structure via the third slot to slide the first driving member along the first slot.

13. The fixing mechanism of claim 12, wherein an oblique angle of the oblique slot is between 30° and 60°.

14. The fixing mechanism of claim 12, wherein the fixing mechanism further comprises a positioning protrusion and a positioning hole, one of the positioning protrusion and the positioning hole is formed on the second side plate, the other of the positioning protrusion and the positioning hole is formed on the transmission structure, and the positioning protrusion is engaged with the positioning hole to fix the transmission structure on the second side plate when the handle pivots to the first position.

15. The fixing mechanism of claim 12, wherein the fixing mechanism further comprises a positioning protrusion and a positioning hole, one of the positioning protrusion and the positioning hole is formed on the handle, the other of the positioning protrusion and the positioning hole is formed on the second side plate, and the positioning protrusion is engaged with the positioning hole to fix the handle at the first position when the handle pivots to the first position.

16. The fixing mechanism of claim 11, wherein the fixing mechanism further comprises an elastic hook, the driven structure further has a blocking member, the elastic hook has an elastic arm portion and a hook portion, the elastic arm portion is disposed on one of the actuator and the second side plate, the hook portion hooks the blocking member to prevent detachment of the containing casing from the holding casing, and the hook portion is disengaged from the blocking member to release the containing casing for making the containing casing detachable from the holding casing when the elastic arm portion is pressed to deform.

17. The fixing mechanism of claim 16, wherein a blocking protrusion is formed on the one of the actuator and the second side plate and located on a side of the elastic arm portion, and the blocking protrusion blocks the elastic arm portion to constrain deformation of the elastic arm portion.

18. The fixing mechanism of claim 11, wherein the guiding slot is a curved slot matched with a track of the driven member moving with the driven structure.

19. The fixing mechanism of claim 11, wherein the fixing mechanism further comprises:
a returning member connected to the at least one first side plate and the driven structure for driving the driven structure to slide to the initial position relative to the at least one first side plate;
wherein when the actuator is located at the second position to make the containing casing abut against the first slot and the driven member via the first driving member and the guiding slot respectively, the returning member drives the first slot against the first driving member for making the containing casing supported on the holding casing obliquely and protrusively;

when the actuator moves to the first position, the first driving member slides the driven structure to the mounting position to make the driven member slide along the guiding slot for moving the containing casing to a position where the containing casing is horizontally contained in the holding casing.

* * * * *